(12) United States Patent
Mahler et al.

(10) Patent No.: US 7,612,457 B2
(45) Date of Patent: Nov. 3, 2009

(54) SEMICONDUCTOR DEVICE INCLUDING A STRESS BUFFER

(75) Inventors: Joachim Mahler, Regensburg (DE); Alfred Haimerl, Sinzing (DE); Angela Wieneke Kessler, Regensburg (DE); Michael Bauer, Nittendorf (DE)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 11/766,404

(22) Filed: Jun. 21, 2007

(65) Prior Publication Data

US 2008/0315438 A1 Dec. 25, 2008

(51) Int. Cl.
*H01L 23/48* (2006.01)
*H01L 21/44* (2006.01)

(52) U.S. Cl. ............................. 257/782; 257/E23.023; 257/E23.039; 257/E23.069; 257/E23.031; 257/E23.034; 257/676; 257/690; 257/696; 257/698; 257/691

(58) Field of Classification Search ................. 257/782, 257/E23.023, E21.476, E23.039, E23.034, 257/E23.069, 676, 690, 691, 692, 693, 696, 257/698, 666, E23.031; 438/612
See application file for complete search history.

(56) References Cited

U.S. PATENT DOCUMENTS

| 4,731,700 | A | * | 3/1988 | Woodward et al. .......... 361/709 |
| 5,923,088 | A | | 7/1999 | Shiue et al. |
| 6,384,486 | B2 | | 5/2002 | Zuniga et al. |
| 6,800,941 | B2 | * | 10/2004 | Lee et al. .................... 257/773 |
| 7,115,985 | B2 | | 10/2006 | Antol et al. |
| 2004/0051184 | A1 | * | 3/2004 | Farnworth et al. .......... 257/787 |
| 2004/0151221 | A1 | * | 8/2004 | Yamamoto et al. ............ 372/32 |
| 2006/0091536 | A1 | | 5/2006 | Huang et al. |
| 2006/0186512 | A1 | * | 8/2006 | Dekker et al. ............... 257/635 |
| 2006/0246811 | A1 | * | 11/2006 | Winters et al. ................ 445/25 |
| 2007/0259271 | A1 | * | 11/2007 | Nanno et al. ................ 429/318 |

FOREIGN PATENT DOCUMENTS

| DE | 69034071 | 1/1991 |
| EP | 0589678 | 3/1994 |
| WO | WO9934442 | 7/1999 |
| WO | WO2006079104 | 7/2006 |
| WO | WO2006103620 | 10/2006 |

* cited by examiner

*Primary Examiner*—Alexander O Williams
(74) *Attorney, Agent, or Firm*—Dicke, Billig & Czaja, PLLC

(57) ABSTRACT

An integrated circuit includes a first surface configured for mounting to a carrier, an active area of the integrated circuit spaced from the first surface, a bond pad disposed over and in electrical communication with the active area, and a ceramic inorganic stress-buffering layer disposed between the active area and the bond pad.

27 Claims, 8 Drawing Sheets

SEMICONDUCTOR DEVICE INCLUDING A STRESS BUFFER

BACKGROUND

Market demand for smaller, lighter, and more powerful electronic devices has driven the development of more compact packages having increased functionality. The desire for more compact packages has led to the development of semiconductor packaging technologies such as fine pitch ball grid arrays (FBGA), chip-scale packages (CSP), wafer-level packaging (WLP), multi-chip module (MCM) technology, and stacked die packaging.

These semiconductor packages include one or more highly functional semiconductor chips mounted to a carrier and electrical connectors attached between the carrier and the chip. The electrical connectors include wires, clips, etc., that electrically connect the chip to the carrier and configure the chip for use in other electronic devices. These highly functional chips have a high circuit density with an increased number of bond pads configured to receive the electrical connectors.

Connection of the electrical connectors between the carrier and the bond pads has the potential to damage the smaller, more densely packed bond pads and the features of the chip under the bond pads. For example, ball bonding is one way of bonding the electrical connectors to the bond pads on the chip. The combination of heat, pressure, and ultrasonic energy employed by ball bonding could undesirably damage an active area of the chip under the bond pad.

For these and other reasons there is a need for the present invention.

SUMMARY

One aspect provides an integrated circuit configured to be mounted to a carrier. The integrated circuit includes a first surface configured for mounting to the carrier, an active area of the integrated circuit spaced from the first surface, a bond pad disposed over and in electrical communication with the active area, and a ceramic inorganic stress-buffering layer disposed between the active area and the bond pad.

BRIEF DESCRIPTION OF THE DRAWINGS

The accompanying drawings are included to provide a further understanding of the disclosure and are incorporated in as a part of this specification. The drawings illustrate embodiments and together with the description serve to explain the principles of the invention. Other embodiments and many of the intended advantages will be appreciated as they become better understood by reference to the following Detailed Description. The elements of the drawings are not necessarily to scale relative to each other. Like reference numerals designate corresponding similar parts.

DETAILED DESCRIPTION

Figure 1:
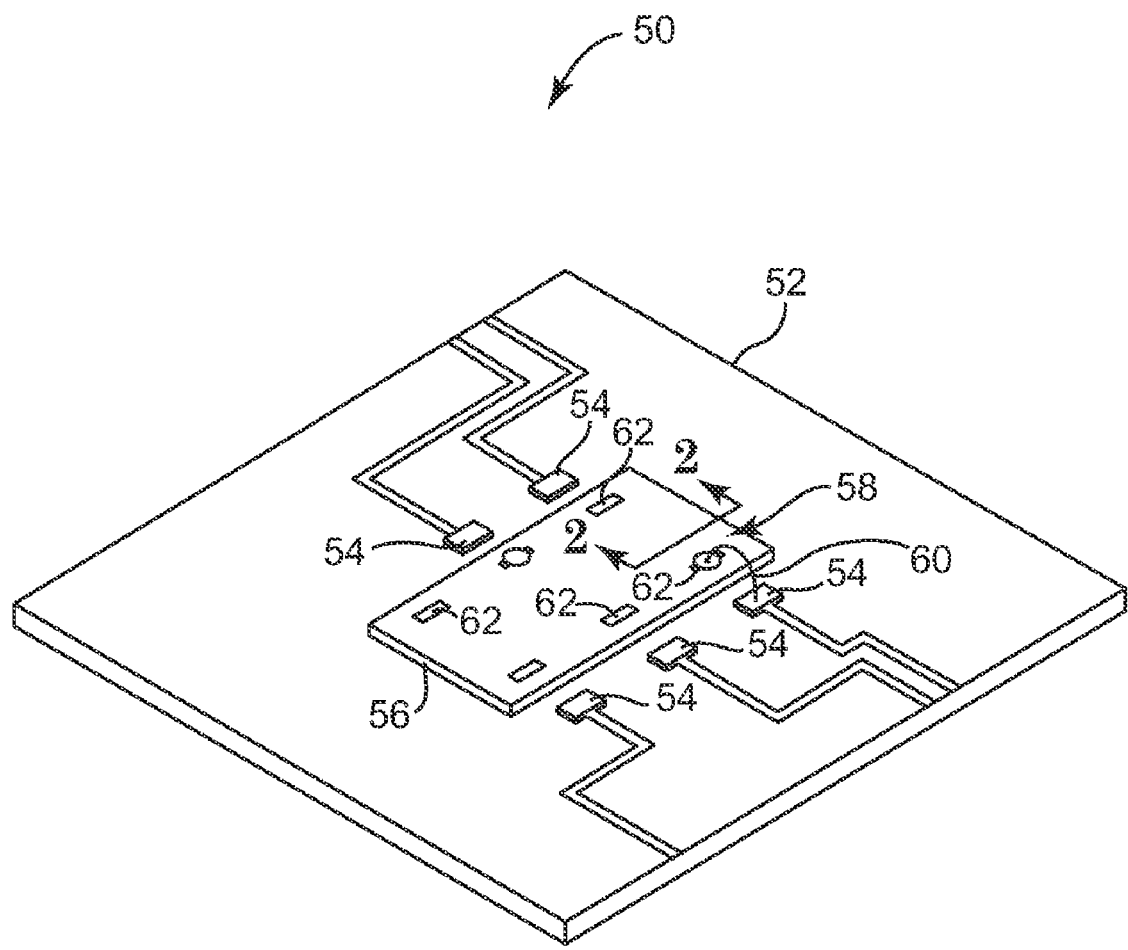
FIG. 1 is a perspective view of a die package semiconductor device including a carrier and a chip attached to the carrier according to one embodiment.

In the following Detailed Description, reference is made to the accompanying drawings, which form a part hereof, and in which is shown by way of illustration specific embodiments. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Ball bonding is a common way to make electrical interconnections between a microchip and a carrier to which the chip is attached, and connections to other devices electrically communicating with the microchip. During ball bonding, a wire or other connector is electrically connected to a bond pad on the chip through a combination of heat, pressure, and/or ultrasonic energy to ensure that the metal connector is durably connected (e.g., soldered) to the microchip. The stress associated with ball bonding connectors to the bond pad of the chip has the potential to damage an upper active area of the chip. The stress associated with other forms of bonding connectors to the bond pad of the chip likewise have the potential to damage an upper active area of the chip.

Embodiments described below provide a semiconductor chip including a stress-buffering layer disposed between a bond pad of the chip and an active area of the chip. The stress-buffering layer is configured to resist the stress/force associated with attaching a connector to the bond pad, and to resist the applied forces and/or mechanical stress applied to a chip undergoing a sorting, wire bonding, or a probe pin testing procedure.

In one embodiment, the stress-buffering layer is an inorganic, non-electrically conductive stress-buffering layer disposed between an upper conducting layer (deposited over an active area of the chip) and the bond pad of the chip. In one embodiment, the stress-buffering layer is a ceramic, non-electrically conductive stress-buffering layer disposed between an upper conducting layer (deposited over an active area of the chip) and the bond pad of the chip.

Some embodiments provide a material formed of amorphous carbon to have properties of natural diamond. In one embodiment, the stress-buffering layer includes diamond-like carbon (DLC). In one embodiment, the stress-buffering layer includes a ceramic inorganic stress-buffering layer. Although forms of DLC include one or more carbon atoms, DLC as described herein is considered an inorganic material due to the lattice structure of the material that provides uniquely hard structures.

In this specification, the term diamond-like carbon (DLC) means any one of the seven forms of amorphous carbon material having an $sp^3$ lattice structure, or a modified $sp^3$ lattice structure including an $sp^2$ lattice portion of carbon bonds, that displays some of the physical properties of natural diamond. DLC is not synthetic diamond.

FIG. 1 is a perspective view of a semiconductor die package 50 according to one embodiment. Die package 50 includes a carrier 52 having contact pins 54, a chip 56 having an active area 58 with the chip 56 attached to carrier 52 such that active area 58 faces away from carrier 52, and a connector 60 (one shown) coupled between contact pin 54 of carrier 52 and a bond pad 62 of chip 56. A capillary tool (not shown) is generally employed to feed and attach connector 60 between bond pad 62 and contact pin 54. Attachment of connector 60 to bond pad 62, sometimes referred to as a ball bond, is typically accomplished through pressing connector 60 onto bond pad 62 in the presence of heat and/or ultrasonic energy. The force thus applied to bond pad 62 has the potential to damage active area 58 of chip 56.

Die package 50 is a semiconductor device that includes chip-scale packages, wafer-level packages, multi-chip modules, and fine pitch ball grid arrays. Embodiments of carrier 52 include leadframes, ceramic carriers, printed circuit boards, and other suitable packaging substrates. In one embodiment, chip 56 is an integrated circuit chip and includes semiconductor chips in general, such as memory chips and controller chips and the like. Embodiments of connectors 60 include bondwires, ribbons, clips, and wires in general. Capillary tool includes any suitable tools configured for ball bond welding (such as ball bond discharge tools), cold welding, wedge bonding, tail bonding, and stud bumping. Other suitable tools for forming a connection between carrier 52 and chip 56 are also acceptable.

Figure 2:
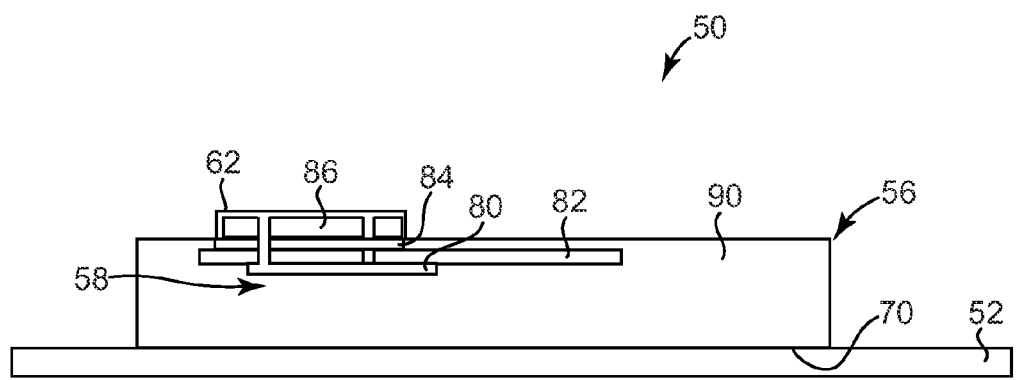
FIG. 2 is a cross-sectional view of the die package semiconductor device illustrated in FIG. 1 showing a stress-buffering layer of an integrated circuit chip according to one embodiment.

FIG. 2 is cross-sectional view of chip 56 attached to carrier 52 according to one embodiment. Chip 56 is fabricated according to semiconductor principals from a silicon wafer and includes a first surface 70 upon which components of chip 56 are fabricated to define active area 58 of chip. Other layers are provided above active area 58 of chip 56 that are configured to enable devices to electrically communicate with active area 58.

For example, in one embodiment chip 56 includes a first metal layer 80 in contact with active area 58, a dielectric layer 82 disposed on first metal layer 80, a metal contact layer 84 disposed on dielectric 82, and a stress-buffering layer 86 disposed between bond pad 62 and metal contact layer 84. In one embodiment, chip 56 is fabricated such that metal contact layer 84 is planarized to define an upper second surface 90 of chip 56 that is generally opposite from first surface 70. Stress-buffering layer 86 and bond pad 62 are generally fabricated on second surface 90 of chip 56.

First metal layer 80 is a conductor in electrical communication with active area 58. Metal contact layer 84 provides an electrical conductor that is configured to electrically communicate with bond pad 62. Both bond pad 62 and metal contact layer 84 electrically communicate with first metal layer 80 and active area 58 through one or more vias or trenches (described below) formed to provide electrical communication between active area 58 and bond pad 62.

Chip 56 is fabricated using one of a variety of suitable semiconductor fabrication processes. With this in mind, in one embodiment first metal layer 80, metal contact layer 84, and bond pad 62 are fabricated from conductive materials such as metals and include, for example, aluminum or aluminum alloys, copper or copper alloys, tungsten, titanium, and elements and alloys of suitable such conductive metals. Examples of suitable conductive materials for first metal layer 80, metal contact layer 84, and bond pad 62 include TiN, TaN, Ta, Ti, TiSN, TaSN, Cr, Tiw, WN, and mixtures and combinations and alloys thereof.

In one embodiment, dielectric 82 is a suitable dielectric material such as silicon dioxide, silicate glass, low-k dielectric materials including SiOC, borosilicate glass, and/or other glass and ceramic dielectric insulators. In one embodiment, dielectric 82 includes $SiO_2$, $SiO_x$, SiON, phosphate silicate glass, borophosphate silica glass, F-containing silicon dioxide, or other low-k films having a dielectric constant (k value) of less than about 3.9. Various low-k materials may be employed as dielectric 82 including spin-on inorganic dielectrics, spin-on organic dielectrics, porous dielectric materials, polymers, silica glass, and fluorinated silicate glass.

In one embodiment, stress-buffering layer 86 includes diamond-like carbon (DLC) that is an amorphous carbon material having properties of natural diamond. Suitable DLC include hydrogen-free amorphous carbon, tetrahedral hydrogen-free amorphous carbon, metal-containing hydrogen-free amorphous carbon, hydrogenated amorphous carbon, tetrahedral hydrogenated amorphous carbon, metal-containing hydrogenated amorphous carbon, and modified hydrogenated amorphous carbon. DLC in its "pure" form includes a lattice structure having an $sp^3$ predominating C—C bond type termed tetrahedral amorphous carbon (ta-C). The tetrahedral amorphous carbon form of DLC has an internal compressive stress related to the $sp^3$ C—C bond type that results in the ta-C form of DLC having a hardness measured by indentation methods to be harder than natural diamond. Embodiments of stress-buffering layer 86 fabricated from ta-C form of DLC are uniquely hard and well suited as a stress buffering layer. In other embodiments, the super hard tetrahedral amorphous carbon DLC can be modified with diluents of hydrogen, $sp^3$ C—C bond types, carbon, silicon, oxygen, fluorine, or metals to have a range of hardness values also suited to be stress buffering layers. In one embodiment, the DLC is defined by a carbon-hydrogen bond and the diluent is defined by X, such that the modified carbon material is defined by C:H:X bonds.

In one embodiment, stress-buffering layer 86 is an electrical insulator. In one embodiment, stress-buffering layer 86 is plasma-activated chemical vapor deposited (PACVD) onto metal contact layer 84 at a thickness of between about 50 nanometers to 5 microns. Other suitable thicknesses that balance the mechanical properties of stress-buffering layer 86 and the space that stress-buffering layer 86 occupies on second surface 90 are also acceptable.

One suitable stress-buffering layer 86 includes DLC modified to include a carbon-hydrogen bond and an additional component, or filler, such as silicon, oxygen, or fluorine. Other suitable stress-buffering layers 86 include elements from Groups 4-6 of the Periodic Table of Elements, nitrides formed of elements from Groups 4-6 of the Periodic Table of Elements, borides of elements from Groups 4-6 of the Periodic Table of Elements, or carbides of elements from Groups 4-6 of the Periodic Table of Elements.

The above-described stress-buffering layer 86 materials have a hardness similar to that of natural diamond and are referred to as "super hard." Super hard materials are defined to be materials having a Vickers hardness (HV) of greater than 4,000 HV (HV has units of $Kgforce/mm^2$), including materials having a Vickers hardness of between about 4000-10000 HV.

As a point of reference, one non-carbon material commonly used as a coating in semiconductor processing is tungsten. Tungsten has a Vickers hardness of about 40 HV and is not considered super hard. In contrast, suitable materials for forming the stress-buffering layer 86 described herein have a hardness much greater than the hardness of tungsten, such that the hardness is on the order of natural diamond. With regard to DLC, and in particular tetrahedral amorphous carbon DLC, in certain cases the $sp^3$ bond angles are distorted and are associated with an internal compressive stress. When tested for hardness with an indentation tool, the internal compressive stress of the DLC shows an apparent hardness that is greater than the hardness of natural diamond.

FIGS. 3-17 are cross-sectional views of one embodiment of fabricating the semiconductor device 56 as illustrated in FIG. 2 according to semiconductor principals from a silicon wafer to include an inorganic, non-electrically conductive stress-buffering layer 86 disposed between bond pad 62 and active area 58 of chip 56. Cross-hatched lines, employed in some of the cross-sectional views, are not employed in all of the views to avoid unnecessarily complicating the drawing(s).

Figure 3:
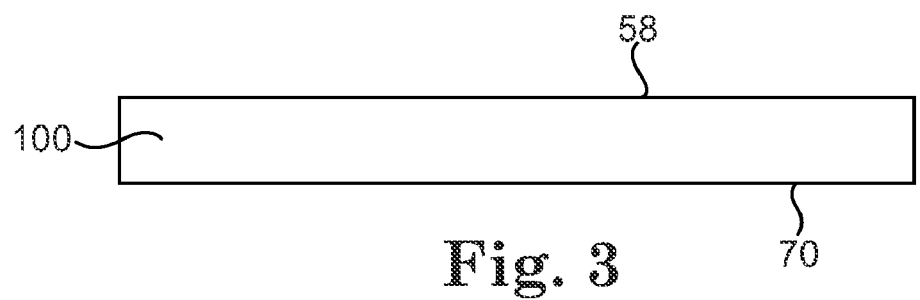
FIGS. 3-17 provide cross-sectional views of the fabrication of the chip illustrated in FIG. 2 according to one embodiment.

FIG. 3 is a cross-sectional view of a chip substrate 100 suitably fabricated from a silicon semiconductor wafer to include first surface 70 and active area 58 of chip 56 (FIG. 2). Substrate 100 would typically be fabricated to include multiple chips 56, only one of which is shown for purposes of illustration clarity.

Figure 4:
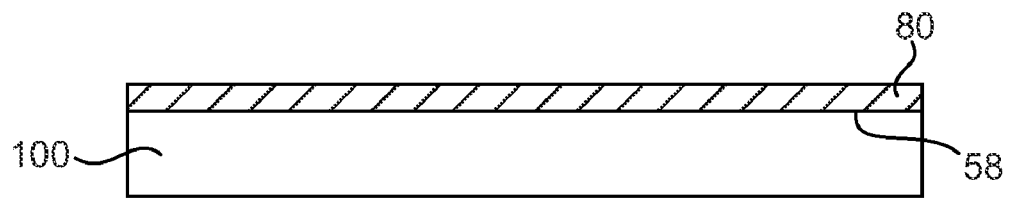

FIG. 4 is a cross-sectional view of first metal 80 deposited onto active area 58. First metal layer 80 is deposited by a suitable deposition process including physical vapor deposition (PVD), chemical vapor deposition (CVD), atomic layer deposition (ALD), electroplating, electroless plating, sputtering, or other suitable deposition techniques.

Figure 5:
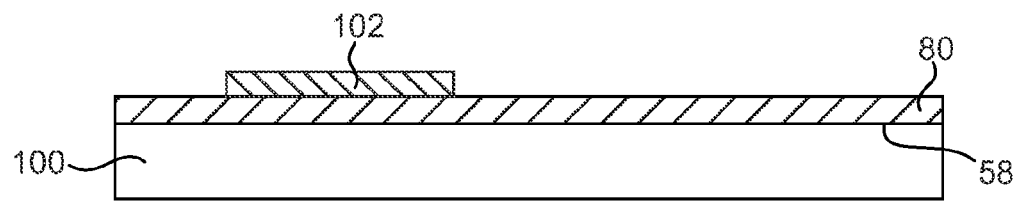

FIG. 5 is a cross-sectional view of a photoresist 102 deposited on first metal layer 80. In one embodiment, photoresist 102 is a positive photoresist and includes a suitable mask (not shown) patterned above photoresist 102 that is configured to selectively expose (e.g., harden) an area under photoresist 102 when photolithographically processed. Subsequent rinse and removal processes result in selectively removing lateral end portions of first metal layer 80 and photoresist 102. It is to be understood that photoresist 102 could include a negative photoresist that can be suitably photolithographically processed to pattern first metal layer onto substrate 100.

Figure 6:
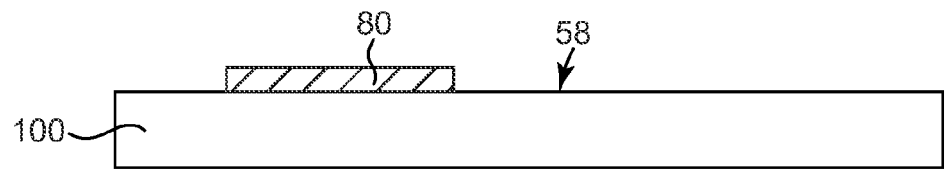

FIG. 6 is a cross-sectional view of first metal layer 80 selectively patterned onto active surface 58 after the rinse and removal processes have been applied to the lateral end portions of first metal layer 80 and photoresist 102 (FIG. 5).

Figure 7:
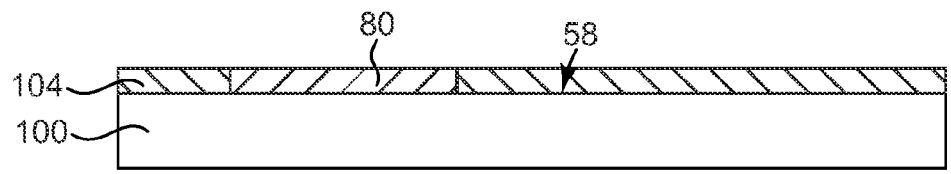

FIG. 7 is a cross-sectional view of the structure shown in FIG. 6 including an insulator 104 deposited alongside first metal layer 80 and suitably planarized. Insulator 104 includes $SiO_2$, $SiO_X$, SiON, phosphate silicate glass, borophosphate silica glass, F-containing silicon dioxide, or other low-k films deposited in a suitable deposition process such as those described above relative to FIG. 4.

Figure 8:
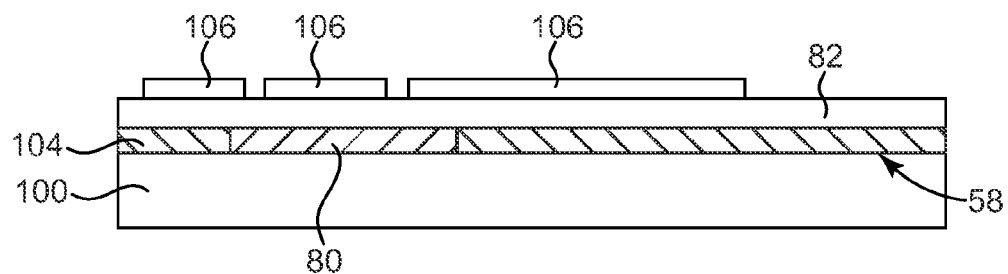

FIG. 8 is a cross-sectional view showing dielectric 82 deposited over first metal layer 80, and a photoresist 106 selectively patterned over dielectric 82. Dielectric 82 includes those materials described above for dielectric 82 deposited in one of the suitable deposition processes described in FIG. 4. One embodiment of photoresist 106 includes a positive photoresist and a suitable mask (not shown) above photoresist 106 that is configured to selectively expose an area under photoresist 106 when photolithographically processed.

Figure 9:
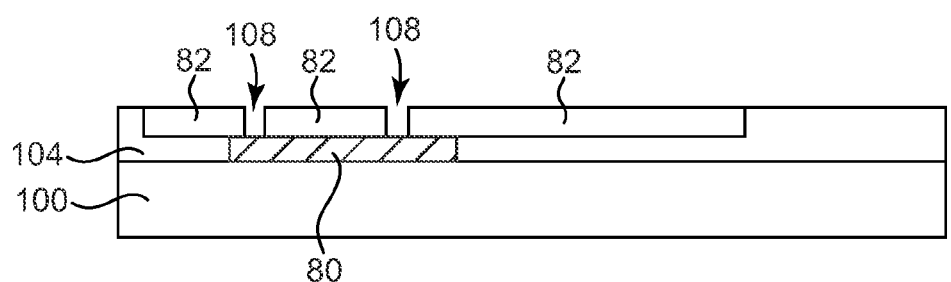

FIG. 9 is a cross-sectional view after photolithographic exposure, removal, and rinsing of photoresist 106 (FIG. 8) and other layers resulting in dielectric 82 patterned over first metal layer 80 to include vias 108 (openings 108). Additional insulator 104 has been deposited alongside dielectric 82 and suitably planarized.

Figure 10:
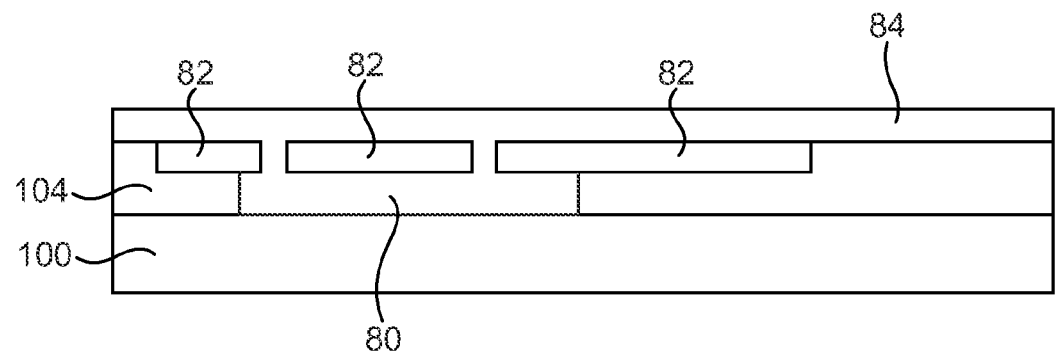

FIG. 10 is a cross-sectional view of metal contact layer 84 deposited onto dielectric 82 and into vias 108 (FIG. 9). Metal contact layer 84 includes those materials described above for metal contact layer 84 deposited in one of the suitable deposition processes described relative to FIG. 4. Metal contact layer 84 is in electrical contact with first metal layer 80, such that these materials are illustrated as continuous.

Figure 11:
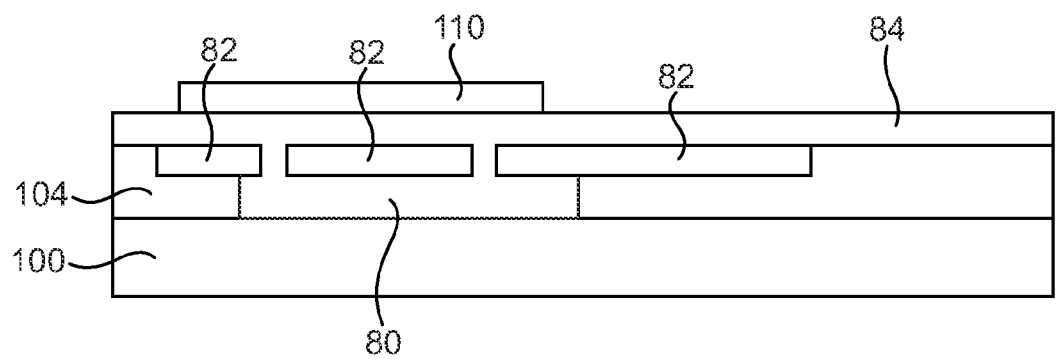

FIG. 11 is a cross-sectional view of one embodiment of a photoresist 110 deposited over metal contact layer 84. In one embodiment, photoresist 110 includes a positive photoresist and a suitable mask (not shown) patterned above photoresist 110 that is configured to selectively expose an area of metal contact layer 84 under photoresist 110 when photolithographically processed.

Figure 12:
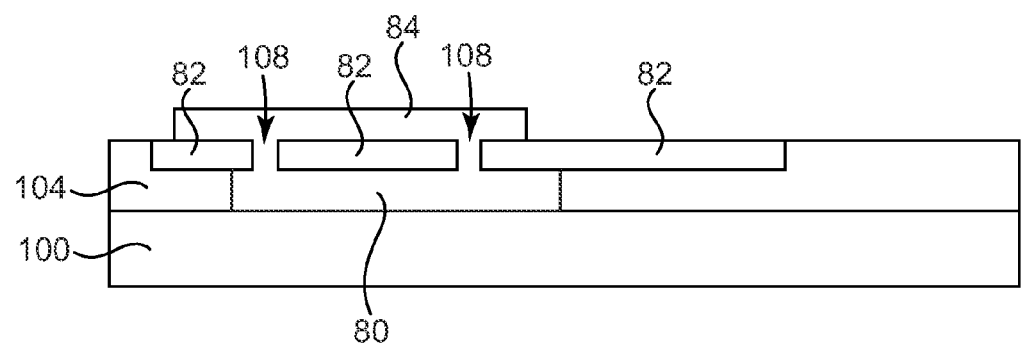

FIG. 12 is a cross-sectional view of metal contact layer 84 selectively patterned and in contact with dielectric 82 after a suitable photolithographic exposure, removal, and rinse process is applied to metal contact layer 84 and photoresist 110 (FIG. 11). Metal in the metal contact layer 84 fills the vias 108 to form electrical communication with first metal layer 80.

Figure 13:
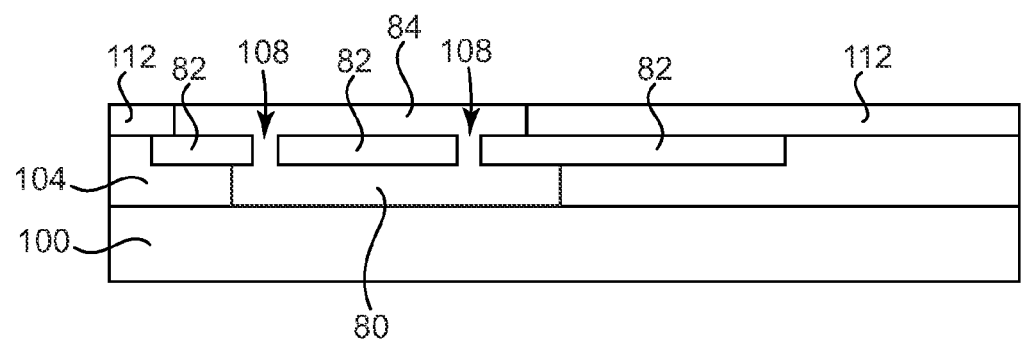

FIG. 13 illustrates an additional insulator 112 deposited alongside metal contact layer 84 after being suitably planarized.

Figure 14:
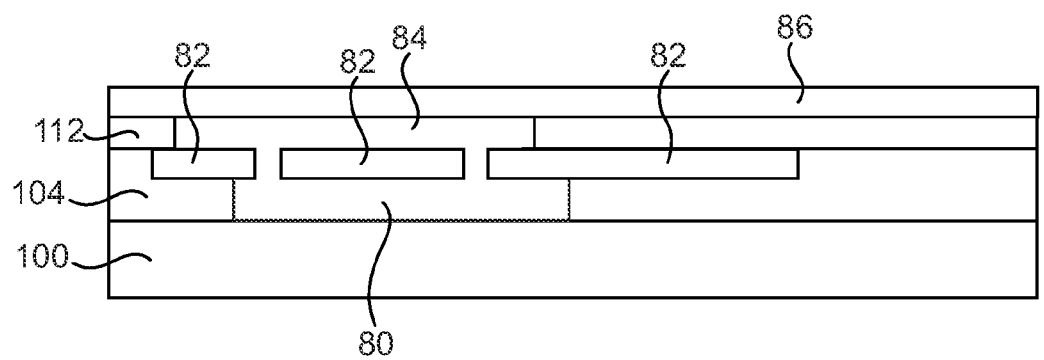

FIG. 14 is a cross-sectional view of stress-buffering layer 86 deposited over metal contact layer 84. In one embodiment, stress-buffering layer 86 is a DLC material that is PACVD deposited over metal contact layer 84 at a thickness of between about 50 nanometers to 5 micrometers. In one embodiment, stress-buffering layer 86 is a strong electric insulator formed of a material including significant amounts of $sp^3$ hybridized carbon atoms. In one embodiment, stress-buffering layer 86 includes a super hard diamond substance having a Vickers hardness of about 4,000-10,000 HV. In another embodiment, stress-buffering layer includes the "pure" form of $sp^3$ predominating C—C bond type, which is a tetrahedral amorphous carbon (ta-C) having a Vickers hardness of between about 4,000-9,000 HV. In one embodiment, the stress-buffering layer includes cubic boron nitride (cBN) having a Vickers hardness of between about 4,000-6,000 HV. In one embodiment, stress-buffering layer 86 deposited over metal contact layer 84 and is configured to have a coefficient of thermal expansion that is similar to (i.e., compatible with) a silicon substrate 100, and/or one or both of metal contact layer 84 and first metal layer 80. That is to say, stress-buffering layer 86 responds to thermal conditions in a manner that is similar to the response of silicon substrate 100 or metal layers 84, 86 to the same thermal conditions.

Other suitable materials for stress-buffering layer 86 include any of the seven DLC described above as having an $sp^3$ predominating C—C bond type, or an $sp^3$ predominating C—C bond type modified to include a diluent of, for example, an $sp^3$ C—C bond type.

In one embodiment, stress-buffering layer 86 includes a coefficient of thermal expansion (CTE) of between 1-10× $10^{-6}$/K (e.g., ppm/K) and is thus configured to have a CTE that is similar to the CTE of the silicon components of semiconductor device 56. In this manner, stress-buffering layer 86 is configured to provide low stresses between stress-buffering layer 86 and silicon substrate 100. In addition, stress-buffering layer 86 is configured to provide low stresses between silicon substrate 100 and metallization layers deposited above substrate 100.

In one embodiment, stress-buffering layer 86 is deposited in a PACVD vacuum-process on equipment having high frequency 13.5 megahertz, with a DC pulse gas intake chamber having precursors of $C_2H_2$, $CH_4$, TMS, or HMDSO. In one embodiment, stress-buffering layer 86 is a DLC that is PACVD deposited in a chamber having a volume of about 1 cubic meter. The coating rate for stress-buffering layer 86 is about 1 micrometer per hour in one embodiment.

Figure 15:
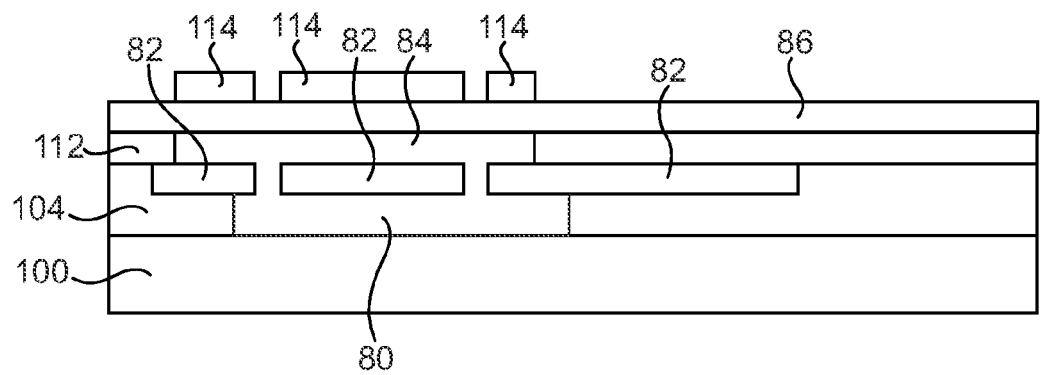

FIG. 15 is a cross-sectional view of a photoresist 114 selectively deposited onto stress-buffering layer 86. One embodiment of photoresist 114 includes a positive photoresist and a suitable mask (not shown) patterned above photoresist 114 that is configured to selectively expose an area of stress-buffering layer 86 under photoresist 114 when photolithographically processed.

Figure 16:
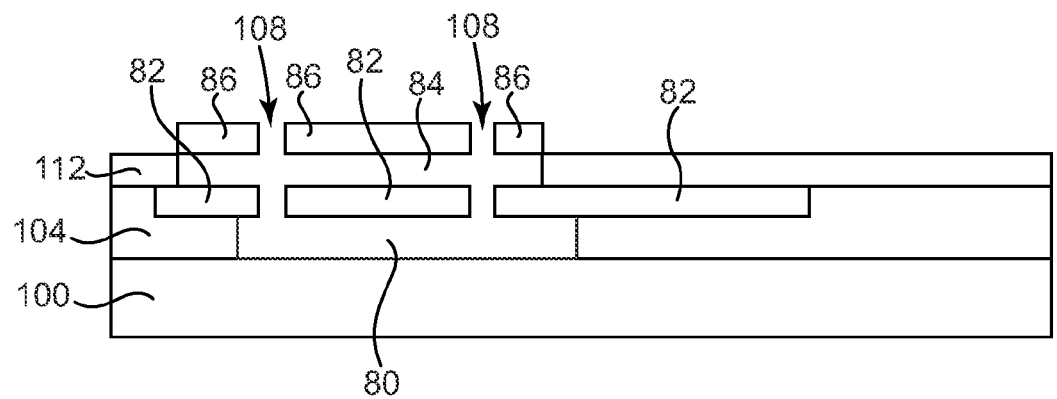

FIG. 16 is a cross-sectional view of substrate 100 after a suitable photolithographic exposure, removal, and rinsing of photoresist 114 (FIG. 15) resulting in the selective patterning of stress-buffering layer 86 over metal contact layer 84. The selective patterning and photolithographic removal of the layers in FIG. 15 results in a trench 108 or via 108 formed in a top portion of stress-buffering layer 86 that communicates with metal contact layer 84 and first metal layer 80.

Figure 17:
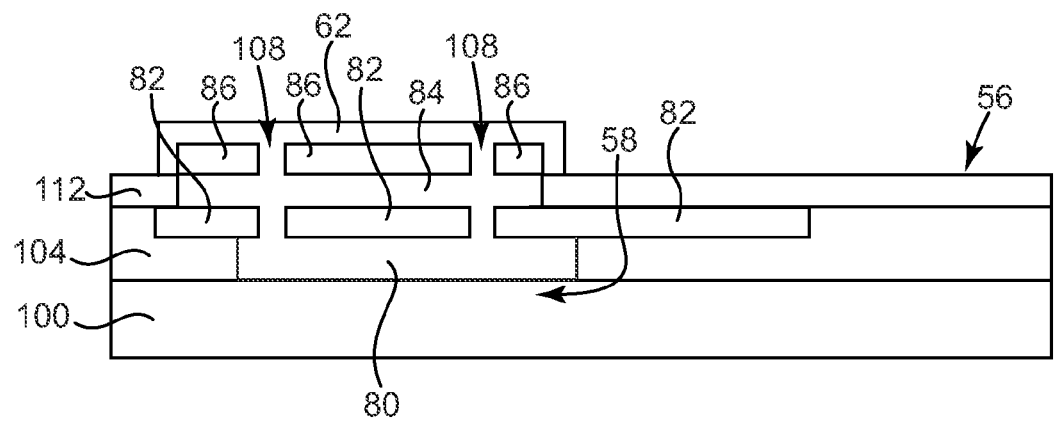

FIG. 17 is a cross-sectional view of bond pad 62 deposited over stress-buffering layer 86 according to one embodiment. Deposition of bond pad 62 selectively fills via 108 to form a metallic electrical interconnect between bond pad 62 and first metal layer 80, where first metal layer 80 is in contact with active area 58 of chip 56. In one includes a conformal coating of metal deposited over stress-buffering layer 86.

In one embodiment, bond pad 62 is deposited to fill via 108 through the use of a PVD, CVD, ALD, electroplating, electroless plating, sputtering process or the like. In one embodiment, bond pad 62 includes aluminum base material such as aluminum, an AlCu alloy, or an alloy of AlCuSi. In one embodiment, bond pad 62 is selectively coated to have a thickness ranging from 15 nanometers to several hundred micrometers thick.

With additional reference to FIG. 2, embodiments described above provide a stress-buffering layer 86 deposited between bond pad 62 and active area 58 of a semiconductor chip 56. During electrical connection of a connector to a top surface of bond pad 62, stress-buffering layer 86 resists, absorbs or otherwise dissipates stress applied to bond pad 62, thereby minimizing stress applied to active surface 58 of chip 56. The hardness of stress-buffering layer 86 is on the order of the hardness of natural diamond. In this regard, the hardness of stress-buffering layer 86 is orders of magnitude harder than other materials commonly coated onto a semiconductor substrate, such as tungsten or titanium.

The hardness of stress-buffering layer 86 in combination with its thickness contribute to its ability to diminish stress delivered to active area 58 of chip 56. Consequently, a desirable balance may be struck between the hardness and amount of stress-buffering layer 86 applied on chip 56, and the amount of surface area occupied by stress-buffering layer 86. In other words, the hardness and thickness of stress-buffering layer 86 combine to provide a suitably durable stress-buffering layer that occupies a minimum of chip space.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of a semiconductor device having an inorganic, non-electrically conductive stress buffering layer. Therefore, it is intended that this invention be limited only by the claims and the equivalents thereof.

What is claimed is:

1. An integrated circuit configured to be mounted to a carrier, the integrated circuit comprising:
   a first surface configured for mounting to the carrier;
   an active area of the integrated circuit spaced from the first surface;
   a bond pad disposed over and in electrical communication with the active area; and
   a ceramic inorganic stress-buffering layer disposed between the active area and the bond pad, the ceramic inorganic stress-buffering layer comprising a hardness of greater than about 500 Kgforce/mm$^2$ that is configured to minimize stress delivered to the active area when attaching a connector to the bond pad.

2. The integrated circuit of claim 1, further comprising:
   a first metal layer in contact with the active area;
   a dielectric layer disposed over the first metal layer; and
   a metal contact layer disposed over the dielectric layer and over the active area of the integrated circuit, the metal contact layer defining an upper surface of the chip;
   wherein the ceramic inorganic stress-buffering layer comprises a non-electrically conductive stress-buffering layer that is disposed on the metal contact layer over the active area of the integrated circuit.

3. The integrated circuit of claim 2, wherein the dielectric layer, the metal contact layer, and the ceramic inorganic stress-buffering layer are fabricated to include a plurality of vias that define an electrical pathway between the bond pad and the first metal layer.

4. The integrated circuit of claim 1, wherein the first surface is a first surface of a silicon substrate, and the ceramic inorganic stress-buffering layer is configured to have a coefficient of thermal expansion (CTE) that is substantially similar to a CTE of the silicon substrate.

5. The integrated circuit of claim 1, wherein the ceramic inorganic stress-buffering layer comprises a diamond-like carbon stress-buffering layer comprising an amorphous carbon having one of an sp$^2$ lattice structure and an sp$^3$ lattice structure.

6. The integrated circuit of claim 1, wherein the ceramic inorganic stress-buffering layer comprises a diamond-like carbon stress-buffering layer comprising tetrahedral amorphous carbon.

7. The integrated circuit of claim 1, wherein the ceramic inorganic stress-buffering layer comprises a diamond-like carbon stress-buffering layer comprising cubic boron nitride.

8. The integrated circuit of claim 1, wherein the ceramic inorganic stress-buffering layer comprises a carbon material modified to include a diluent selected from the group consisting of hydrogen, carbon, silicon, oxygen, and fluorine.

9. The integrated circuit of claim 8, wherein the carbon material is defined by a carbon-hydrogen bond and the diluent is defined by X, such that the modified carbon material is defined by C:H:X bonds.

10. The integrated circuit of claim 1, wherein the ceramic inorganic stress-buffering layer comprises an element from groups 4-6 of the periodic table of elements, nitrides of an element from groups 4-6, borides of an element from groups 4-6, and carbides of an element from groups 4-6.

11. The integrated circuit of claim 1, wherein the ceramic inorganic stress-buffering layer comprises an electrical insulator.

12. The integrated circuit of claim 1, wherein the ceramic inorganic stress-buffering layer is characterized by an absence of tungsten.

13. A semiconductor device comprising:
   a carrier;
   a chip including a first face and a second face opposite the first face, the first face coupled to the carrier and the second face including a metal contact layer disposed over an active area of the chip, a carbon stress-buffering layer disposed on the metal contact layer over the active area of the chip, and a bond pad disposed on the carbon stress-buffering layer.

14. The semiconductor device of claim 13, wherein the carbon stress-buffering layer comprises amorphous carbon including a hybridized carbon atom having one of an sp$^2$ lattice structure and an sp$^3$ lattice structure.

15. The semiconductor device of claim 13, wherein the carbon stress-buffering layer comprises a thickness of between about 5 nanometers-5 micrometers.

16. The semiconductor device of claim 15, wherein the carbon stress-buffering layer comprises plasma activated chemical vapor deposited DLC at a thickness of between about 0.5-5.0 micrometers.

17. A semiconductor device comprising:
a carrier;
a chip including a first face and a second face opposite the first face, the first face coupled to the carrier and the second face including an active area of the chip, and a bond pad disposed over the second face in electrical communication with the active area of the chip; and
amorphous carbon means disposed between the active area of the chip and the bond pad for minimizing connector stress at the active area of the chip when bonding an electrical connector to the bond pad;
wherein the amorphous carbon means comprises an electrical insulator.

18. The semiconductor device of claim 17, wherein the amorphous carbon means is deposited to have a thickness of between about 5 nanometers-5 micrometers.

19. The semiconductor device of claim 17, wherein the amorphous carbon means comprises an element from groups 4-6 of the periodic table of elements, nitrides of an element from groups 4-6, borides of an element from groups 4-6, and carbides of an element from groups 4-6.

20. A die package comprising:
a carrier including contact pins;
a chip including a first face and a second face opposite the first face, the first face coupled to the carrier and the second face including an active area of the chip, and a bond pad disposed over the second face in electrical communication with the active area of the chip;
a connector extending between one of the contact pins and the bond pad;
wherein the chip includes a ceramic inorganic material disposed between the active area of the chip and the bond pad, the ceramic inorganic material configured to minimize stress at the active area of the chip when connecting the connector to the bond pad.

21. The die package of claim 20, wherein the carrier comprises one of a leadframe, a ceramic carrier, and a printed circuit board, and the ceramic inorganic material comprises a hardness greater than the hardness of tungsten.

22. The die package of claim 21, wherein the ceramic inorganic material comprises diamond-like carbon having a Vickers hardness of between about 4000-10000 Kgforce/mm$^2$.

23. The die package of claim 20, wherein the ceramic inorganic material comprises an electrical insulator.

24. The die package of claim 20, wherein the ceramic inorganic material comprises diamond-like carbon having an amorphous carbon having an sp$^3$ lattice structure.

25. The die package of claim 20, wherein the ceramic inorganic material comprises one of a tetrahedral amorphous carbon and a cubic boron nitride.

26. The integrated circuit of claim 1, wherein the ceramic inorganic stress-buffering layer comprises a Vickers hardness of between about 4000-10000 Kgforce/mm$^2$.

27. The semiconductor device of claim 13, wherein the chip comprises chip sides extending between the first and second faces, the carbon stress-buffering layer not disposed on the chip sides.

* * * * *